United States Patent [19]

Huott et al.

[11] Patent Number: 5,659,551
[45] Date of Patent: Aug. 19, 1997

[54] PROGRAMMABLE COMPUTER SYSTEM ELEMENT WITH BUILT-IN SELF TEST METHOD AND APPARATUS FOR REPAIR DURING POWER-ON

[75] Inventors: William Vincent Huott, Holmes; Tin-Chee Lo, Fishkill; Pradip Patel, Poughkeepsie; Timothy John Slegel, Staatsburg, all of N.Y.

[73] Assignee: International Business Machines Corporation, Armonk, N.Y.

[21] Appl. No.: 572,843

[22] Filed: Dec. 14, 1995

Related U.S. Application Data

[63] Continuation-in-part of Ser. No. 450,585, May 31, 1995.

[51] Int. Cl.⁶ ................................. G06F 11/00
[52] U.S. Cl. .................. 371/22.2; 371/22.5; 395/185.06
[58] Field of Search .................. 371/22.2, 21.1, 371/21.2, 22.5, 25.1, 22.6; 395/185.06, 183.06, 183.16, 183.18; 365/201

[56] References Cited

U.S. PATENT DOCUMENTS

| | | | |
|---|---|---|---|
| 4,740,970 | 4/1988 | Burrows et al. | 371/15 |
| 4,841,485 | 6/1989 | Prilik et al. | 365/201 |
| 5,173,906 | 12/1992 | Dreibelbis et al. | 371/22.5 |
| 5,224,101 | 6/1993 | Popyack, Jr. | 371/21.1 |
| 5,313,424 | 5/1994 | Adams et al. | 365/200 |
| 5,386,392 | 1/1995 | Cantiant et al. | 365/233 |
| 5,420,824 | 5/1995 | Kajimoto et al. | 365/230.01 |
| 5,442,641 | 8/1995 | Beranger et al. | 371/21.2 |
| 5,511,164 | 4/1996 | Brunmeier et al. | 395/185.06 |
| 5,535,164 | 7/1996 | Adams et al. | 365/201 |
| 5,544,106 | 8/1996 | Koike | 365/200 |

OTHER PUBLICATIONS

IBM Journal of Research and Development. "Boundary--Scann Design Principles for Efficient LSSD ASIC Testing", by R. W. Bassett et al. vol. 34, No. 2/3, Mar./May, 1990.

USSN 08/450,585 Filed May 31, 1995, by Turgeon et al, entitled "Programmable Built-In Self Test Method and Controller for Arrays". IBM Docket #PO995004.

USSN 08/572,841 Filed Dec. 14, 1995 by Lo et al, entitled "Programmable ABIST Microprocessor for Testing Arrays with Two Logical Views". IBM Docket #PO995059.

*Primary Examiner*—Robert W. Beausoliel, Jr.
*Assistant Examiner*—Nadeem Iqbal
*Attorney, Agent, or Firm*—Lynn L. Augspurger

[57] ABSTRACT

Computer system element has a VLSI array with redundant areas and an ABIST (Array Built-In Self Test) system having mirror image fuse registers enabling scan of failed addresses to be used to replace hardware errors detected during power-on at a customer location. The ABIST controller allows self test functions (e.g. test patterns, read/write access, and test sequences) to be modified without hardware changes to the test logic. Test sequence is controlled by logical test vectors, which can be changed, making the task of developing complex testing sequences relatively easy and useful for enabling array self-tests to be performed in a customer's office at power-on reset.

9 Claims, 6 Drawing Sheets

PROGRAMMABLE COMPUTER SYSTEM ELEMENT WITH BUILT-IN SELF TEST METHOD AND APPARATUS FOR REPAIR DURING POWER-ON

CROSS REFERENCE TO RELATED APPLICATIONS

This application is a continuation-in-part of the following co-pending patent application, and the applicants claim priority therefrom: U.S. Ser. No. 08/450,585 Filed May 31, 1995, by Turgeon et al, entitled "Programmable Built-In Self Test Method and Controller for Arrays;

FIELD OF THE INVENTION

This invention relates to an improved built-in system for testing integrated circuits, and more particularly to a method and apparatus using a built-in array test system that is programmable in computer systems to enable array self tests to be performed in a customer's office at power-on reset.

This application is also related to the following application filed concurrently herewith: U.S. Ser No 08/572,841 filed Dec. 14, 1995 by Huott et al. entitled "Programmable ABIST Microprocessor for Testing Arrays with Two Logical Views".

These co-pending applications and the present application are owned by one and the same assignee, International Business Machines Corporation of Armonk, N.Y.

The description set forth in these co-pending applications is hereby incorporated into the present application by this reference.

BACKGROUND OF THE INVENTION

As background for our invention computer systems use arrays to store information and these arrays are sometimes subject to hardware errors: individual array cell, bitline, wordline, etc. When most large arrays are designed, they have redundant areas (typically bitlines or wordlines), that may be used to replace the normal functional areas of the array if a hardware error is found in them. However, previously these redundant areas have only been used during the chip manufacturing process to repair defects, typically by blowing fuses on the array to force the redundant cells to replace the defective cells. Estimates show that only about 10% of the time, the manufacturing process will have to utilize these redundant areas to produce a fully working chip.

In addition, typically arrays have a self-test apparatus built into them for testing the array: Array Built-In Self-Test (ABIST). This apparatus is typically used to test the array during the manufacturing process and when the computer system is powered-on at the customer's location.

For a background of our invention, reference to the application listed above, and to the discussion herein relating to our improved ABIST test and apparatus which enables us using the invention described herein to make use of redundant (or spare) cells that were not used in the manufacturing operation.

In general, during manufacturing of a computer system, integrated circuit arrays are tested by providing a known data input at a known address to the array and comparing the output to the expected output. One well-known and widely used prior art system for testing integrated circuit logic, particularly integrated circuit memory arrays, is to form a dedicated test circuit on the chip with the array itself. This is called Array Built-In Self Test (ABIST) logic.

An early example of ABIST technology, one that allowed elimination of an alternative microprocessor self test via a PLA LSSD test with I/O isolation of RAM functional test with no performance measurement, is represented by U.S. Pat. No. 4,841,485, granted Jun. 20, 1989 to R. J. Prilik et al, and assigned to International Business Machines Corp. This basic patent provided a memory array of bistable memory cells connectable to two different voltages that will operate when biased with both voltages at the same level in a bistable mode, and when biased at different voltage levels, will operating in an embedded self test binary pattern mode. The uses of this base technology also has been explored by others. Some related ABIST developments have been referenced above in the related pending applications of the assignee. There have been IBM Publications also relating to the area, including the IBM Journal of Research and Development article R. W. Bassett et al, "Boundary-Scann Design Principles for Efficient LSSD ASIC Testing, Vol. 34, No. 2/3 March/May 1990. Other IBM patents in the field include U.S. Pat. Nos. 5,442,641; 5,173,906 and 5,386,392.

With the many inventions in this field which have been made, this technology now allows high speed testing of the array without having to force correspondence between the array and the input/output connections to the chip itself.

U.S. Pat. No. 5,173,906 to Dreibelbis et al, issued Dec. 22, 1992, provides a BIST (Built-In Self Test) function for VLSI logic or memory module which is programmable. This circuitry is provided with a looping capability to enable enhanced burn-in testing. An on-chip test arrangement for VLSI circuits is provided with programmable data pattern sequences wherein the data patterns are selectable via instruction code in order to reduce the probability of self test redesign. However, this Dreibelbis patent does not provide flexibility to test VLSI circuits with any and all tests which can be required to test both static and dynamic arrays, in accordance with the invention claimed in U.S. Ser. No. 08/450,585 Filed May 31, 1995, by Turgeon et al, entitled "Programmable Built-In Self Test Method and Controller for Arrays". Generally, this prior application is our preferred ABIST embodiment for the present application representing an ABIST that has the programmable ability to test and identify defective array locations and using our invention to take corrective action.

In spite of the ABIST advancement for computer systems which use arrays to store information, there is a problem that our invention solves which is that if a defect is later found after the system had been shipped to the customer, there was no way to make use of these redundant cells that were never used during the manufacturing process. In fact, in some computer systems, if an array failed in the customer's location, it would not be possible to perform a power-on reset of the system, since the ABIST test of the defective array would not complete successfully.

While ABIST advancement has existed for some time, nevertheless the problem that a defect found after system shipment to a customer has likewise existed for some times. Several methods have been used in the past to solve this problem of array defects in the customer's location. Some recent computer systems used some form of line delete to remove bad sections of an array from use while the System is running. In large mainframes manufactured by IBM this information obtained during manufacturing had always been saved by the Service Processor, so it can be reloaded into the arrays at the next power-on reset. Therefore, if the self-test on the array fails, it can be ignored since there is information kept of all previous problems found and this information is reloaded to delete all previously defective locations.

However, in more modern developments which provide reduced cost machines, constraint have been placed on the Service Processor which is unable to save the defective array location information for a later reload, because this defective array location information can not be kept in the Service Processor. Therefore, the only "safe" thing to do would be to not allow continued operation after an array self-test operation fails during power-on reset. This would provide a severe impact to customer availability. The power on reset would fail.

The IBM bi-polar mainframe known as the IBM series ES/9000-9021 implemented a mechanism called STAR (Self Test Address Relocation) in its level two cache that allows redundant array areas to replace defective array locations. However, it does not make use of a programmable ABIST utilized in our improved apparatus which we have described, but it used additional complex and expensive logic/state machines to automatically determine repair actions.

So, it is important problem in modern systems, to provide a reduced cost computer system that has no way to retain defective array location information after the manufacturing process is complete to be repaired at a customer location at power-on reset time. In fact, with modern systems, if the array fails at the customer's locations, it would not be possible, without our invention to perform a power-on reset of the system, since the ABIST test of the defective array would not complete successfully.

SUMMARY OF THE INVENTION

Our invention provides for use of the ability of the ABIST to identify defective array locations and identify possible corrective actions. It then implements a mechanism where the redundant array areas, that have not been used for manufacturing repair, can replace the defective locations. Finally, another ABIST test is run to verify if the repair action was successful.

In addition, it will be appreciated after reading the following detailed disclosure, that we have provided latches that override a fuse mechanism and provided for the use of the Service Processor to load replacement values, and for retesting the repair using the ABIST in the customer location during power-on, These and other improvements are set forth in the following detailed description. For a better understanding of the invention with advantages and features, refer to the description and to the drawings.

BRIEF DESCRIPTION OF THE DRAWINGS

The foregoing and other objects, aspects and advantages will be better understood from the following detailed description of a preferred embodiment of the invention with reference to the drawings, in which:

FIG. 2 is a block diagram showing a specific possible embodiment of an array built in test system, while FIG. 3 is a block diagram similar to FIG. 2 showing an implementation of the invention with a failed address capture function, like that shown in our prior application, which may be employed for performing repairs later in the field when used with the structure of our preferred embodiment of a computer system element as illustrated in FIG. 5, in our preferred embodiment, while

DETAILED DESCRIPTION OF THE INVENTION

Before considering our preferred embodiments in detail, it should be understood, by way of example, in accordance with the invention we provide for use of our programmable ABIST, which has test functions including, but are not limited to, the following examples.

Test data controls provide patterns which may be held constant for the duration of a particular test sequence, circulated in a loop (marching a 0 through all bit positions against an all 1's background, for example), circulated in a loop using an external carry bit (this allows for further modification of the test pattern), inverted as it circulates in a loop, and complemented within the data in register.

Array address controls allow stepping addresses in ascending or descending order, along bit-line or word-line addressing order. Array addresses may also be held constant for repeated, consecutive accesses of the same address. The array address controls also enable stepping along bit-line and word-line addresses within a given test sequence.

Array write controls allow any combination of read/write sequences, limited only by the size of the microcode array. For example, the read/write controls may allow write-then-read and read-then-write test sequences on an address under test, multiple writes-then-read to an address under test, multiple reads-after-write to an address under test, and programmable combinations of read/write operations to particular addresses or address ranges.

The array address and test data controls also allow for branching within the test sequence, including simple "back to the origin" branches, or branches to an address, as well as branches on condition.

The test data patterns, array address controls, and array write controls are initialized via scanning. The microcode pointer control register thereby controls the various test state machines via the logical test vectors to enable "at speed" functional testing of the array. Test results are gathered via scanning. Subsequent test scenarios are also scanned in. Failures can also be monitored and identified using the features provided in the ABIST illustrated in FIG. 3.

Figure 1:
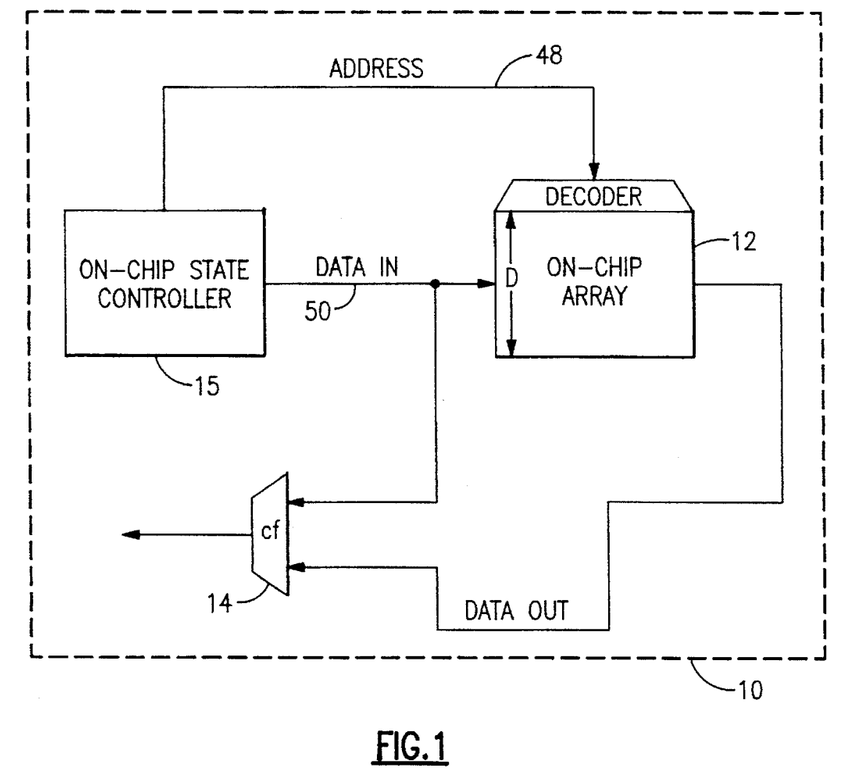
FIG. 1 is a general block diagram showing a portion of an integrated circuit chip with a memory array and an array built-in self test system both formed in the chip.

Having described generally the features and use of our invention, FIG. 1 which illustrates our preferred embodiment in which a region 10 of an integrated circuit chip has formed therein a memory array 12, which is D bits wide. It is this VLSI store for information array area 12 which employs the redundancy of the array described with respect to FIG. 4. Thus formed on the chip region 10, and the VLSI information store array 12 is an array built-in self test system ABIST, which includes a programmable state controller 15 also known as ABIST engine. The computer element which we proved for a computer system allows store of information in individual array cells, and more typically in multiple cells arranged as bitlines or wordlines of the VLSI array. In accordance with our invention, as illustrated specifically in FIG. 4 schematic expansion of the VLSI array 12 showing in detail redundant areas of the VLSI (shown only) wordlines array 12 are used to replace the normal functional areas of the array if a hardware error is found in them after a computer system having the computer element is shipped to a customer location.

In our preferred embodiment, the VLSI array and ABIST cooperate to enable in field power-on reset repair of defective array locations found on power-on at the customer location. The programmable state controller 15 generates a sequence of data pattern inputs and address inputs to the array 12. The data pattern is written into the array 12 and then read out. Comparator 14 compares the data output of the array with the expected data output pattern (i.e. the input data pattern) and provides, for example, a compressed pass/fail output indication in form of "signature" as in FIG. 2 or, in the preferred embodiment of the invention shown in FIG. 3, a failed address function that identifies the address at which an error occurred.

Figure 3:
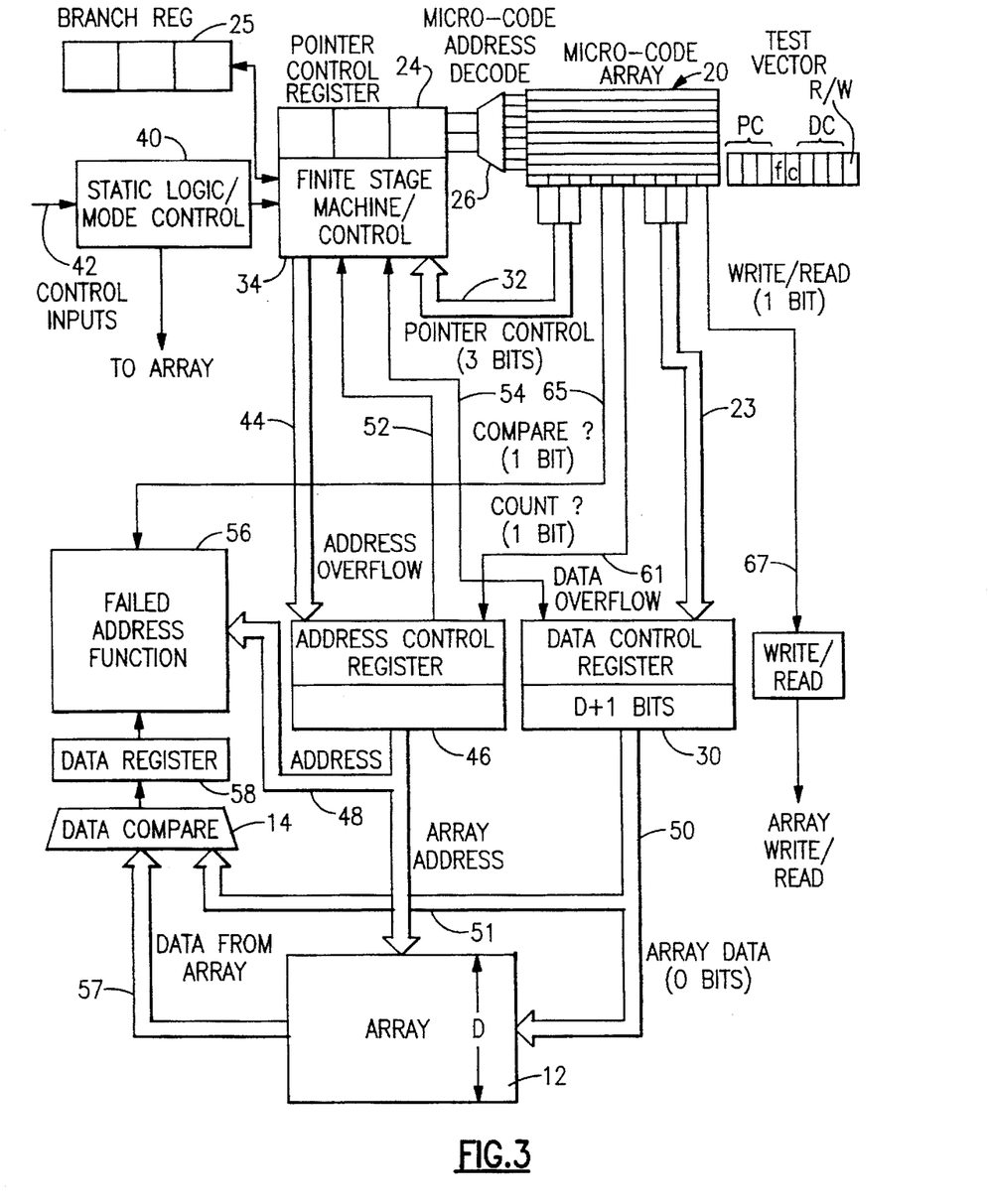

Referring now to FIG. 3 of the drawings, in this exemplary embodiment of the invention, an array 20 of memory elements, for example, eight, nine-bit instruction registers, in combination with a microcode pointer control register 24, functions as programmable state sequencer. A microcode address decoder 26 couples the microcode pointer control register 24 to the scannable array 20. During each cycle, one instruction register is selected by the pointer and the contents of the register is read out and used to determine the action to be taken. Two actions are possible in this specific exemplary embodiment; (a) send signals to other test control elements, and (b) alter the pointer register 24 (i.e. increment the pointer, decrement the pointer, hold current pointer value, reset the pointer to zero, or change pointer to value contained in branch register).

Figure 2:
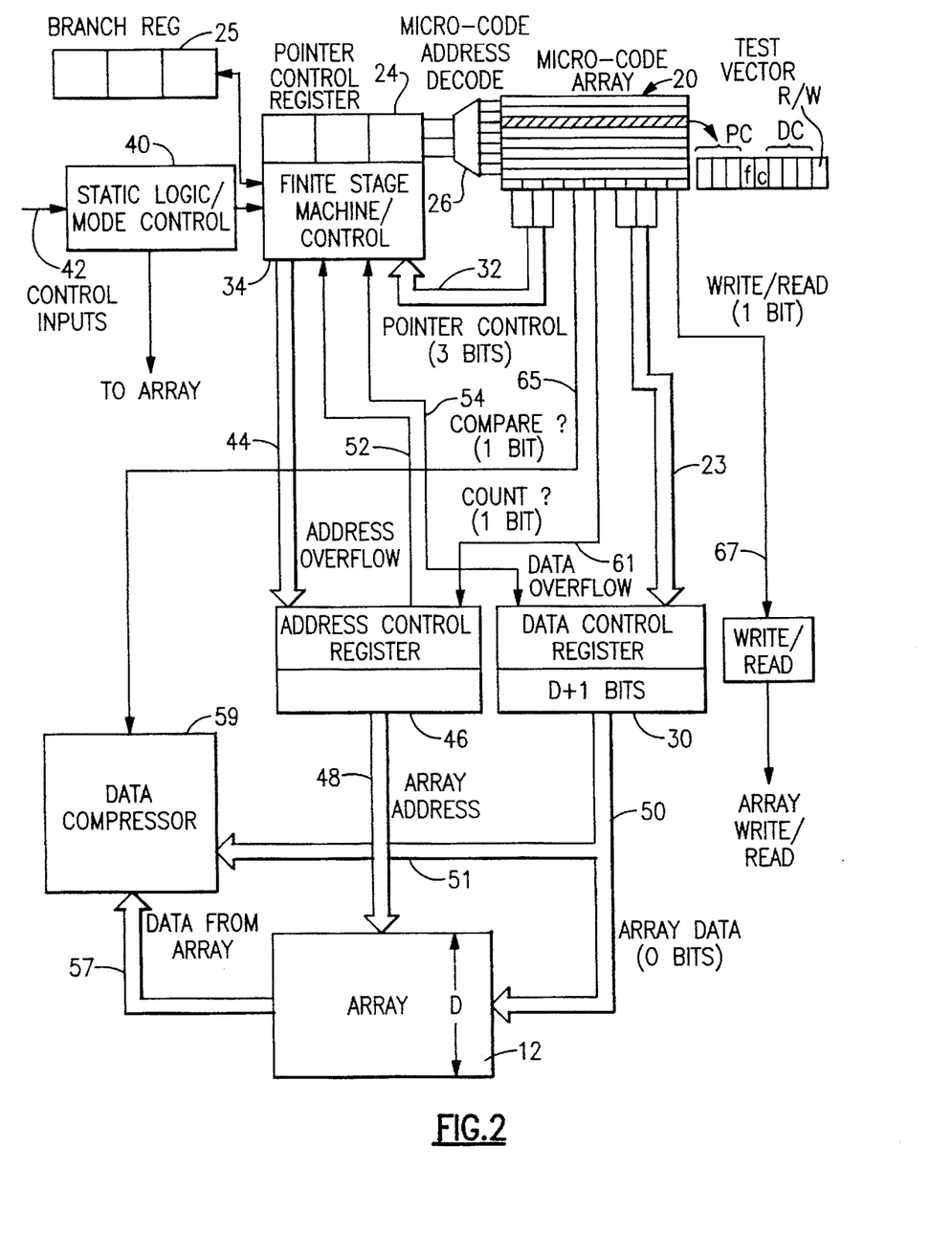

Each instruction vector stored in the Micro-code array 20 has five fields; a three bit pointer control field PC, a one bit failed address function control field f; a one bit address count control field c; a three bit data control field DC, and a one bit read/write control field r/w as shown in FIGS. 2 and 3.

A bus 23 couples the three bit data control field from a register selected by the pointer 24 to a data control register 30 of the array. The data control register is D+1 bits wide, where D is equal to the width of the array 12. In this embodiment of the invention, there are eight possible operations that can be performed on the data in register 30.

These operations are:
rotate data by D bits;
rotate data by D bits with invert;
rotate data by D+1 bits;
rotate data by D+1 bits with invert;
hold data;
invert data;
reset data; and
checkerboard data.

A bus 32 couples the three bit pointer control field from array 20 to finite state control logic 34, which loads the microcode pointer control register 24 with an address specified by the pointer control field. Alternatively, the state control logic 34 loads the contents of a branch register 25 into the microcode pointer control register when the pointer control field specified a branch on register operation. There are eight possible operations that can be performed on the contents of the microcode pointer control bus 32. These operations are:
branch to branch register 25;
increment (unconditional);
increment on Address Overflow else hold;
increment on Address Overflow else go to 0;
increment on Data Overflow else hold;
increment on Data Overflow else go to 0;
increment on Address Overflow else −1; and
increment on Data Overflow else −1.

A static logic/mode control 40, coupled to the state control logic 34, is used to enable or disable the programmable ABIST in response to an external control input 42.

A bus 44 couples the address sequencing instruction from the state control logic 34 to an address control register 46 of the array. There are four possible address mode sequences. These are:
increment by Bit Address;
decrement by Bit Address;
increment by Word Address; and
decrement by Word Address.

Busses 48 and 50 respectively couple the outputs of the address control register 46 and the data control register 30 to the array 12. Busses 52 and 54 respectively couple the address overflow state of the address control register 46 and the data overflow state of the data control register 30 to the state control logic 34. A bus 51 couples data read into array 12 to a suitable data compressor 59 known in the prior art where it is compared with data on bus 57 read from array 12. In one embodiment of this invention, a data out register and a function generator can be specifically added to perform a multiple input signature register (MISR) function. In another embodiment, existing array registers can be used to implement the MISR function.

A bus 61 of FIG. 3 couples the one bit address count control field c from the microcode array 20 to the address control register 46 in order to enable or inhibit the change of address in accordance with the state of address count control field. A bus 65 couples the one bit failed address function control signal to enable or disable the failed address function logic 56 for trapping of faulty address.

Conductors 52 and 54 couple respectively the overflow status of the address control register 46 and an overflow status of the data control register 30 to the state control logic 34. A conductor 67 couples the one bit read/write control field of the millicode array vector to a read/write control 68 of the array 12.

In this specific embodiment of the invention, the data control operators code points are:
000 Rotate data by D bits
001 Rotate data by D bits with invert
010 Rotate data by D+1 bits
011 Rotate data by D+1 bits with invert
100 Hold data
101 Invert data
110 Reset data
111 Checkerboard data The pointer sequence control operators code points are:
000 Branch to branch register 25
001 Increment (Unconditional)
010 Increment on Address Overflow else hold
011 Increment on Address Overflow else go to 0
100 Increment on Data Overflow else hold
101 Increment on Data Overflow else go to 0
110 Increment on Address Overflow else −1
110 Increment on Data Overflow else −1

The address control operators code points are:
00 Increment by Bit Address
01 Decrement by Bit Address
10 Increment by Word Address
11 Decrement by Word Address In operation, microcode array 20 and the microcode pointer control register 24 together act as a programmable state sequencer. During each cycle, one instruction register is selected by the pointer and is used to determine what action is to be taken. In addition, the data overflow and address overflow state is coupled to the state control logic 34 in order, in some cases, to update the pointer. The control logic 34 looks at the overflow bit and provide "branch" in the test sequence based on its value. The mode control address function 40 allows addresses to be changed sequentially, either along the bit lines or word lines, either increasing or decreasing. The read/write register determines whether a read or a write operation is to be performed in this test cycle. The state control logic 40 can branch in response to an address overflow state controlled by 52 and the address can be held in the address register 46 unchanged in response to the count bit 61 in order to apply multiple write and/or read array signals for stressing the array address.

Figure 4:
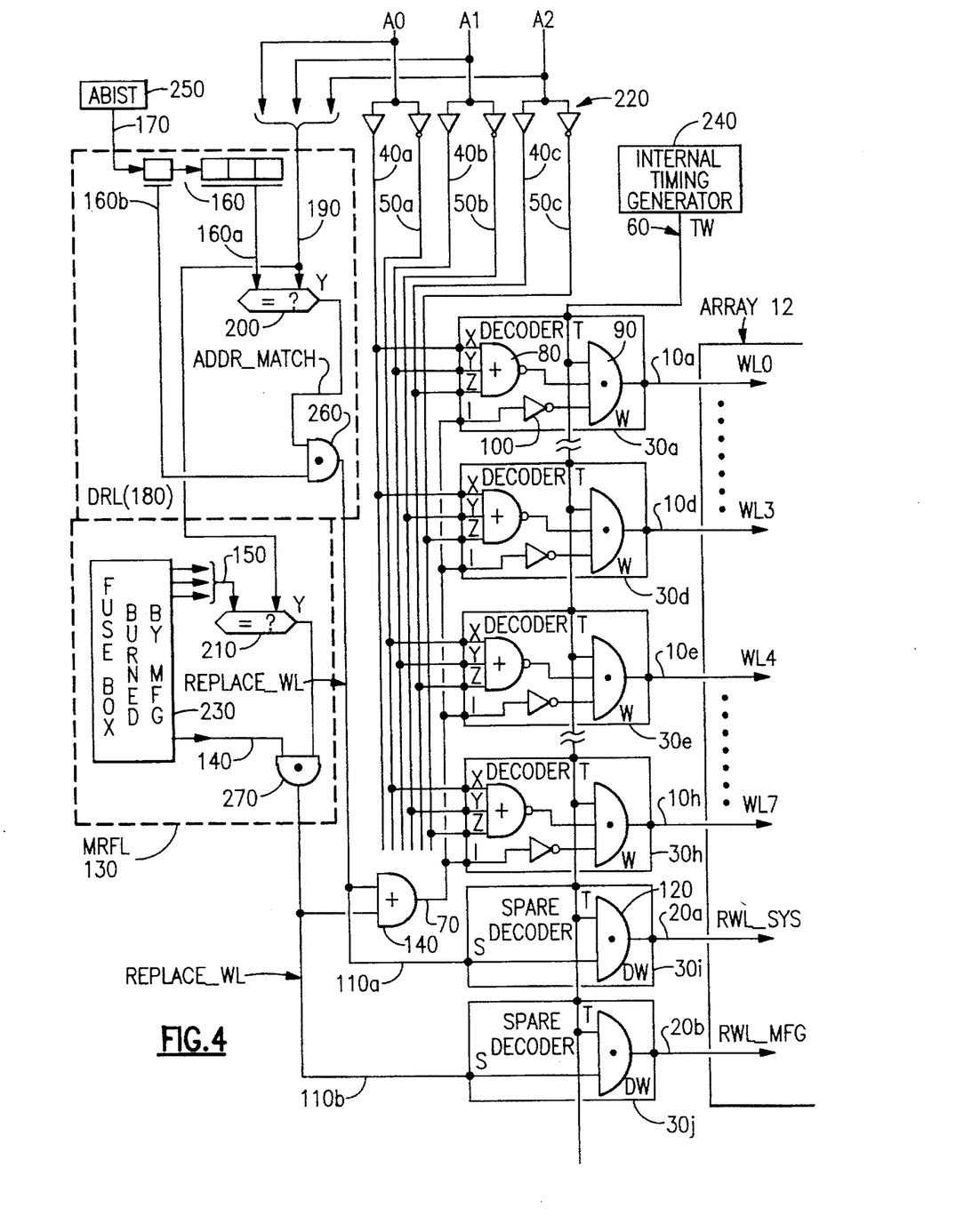
FIG. 4 is schematic illustration of our invention in which redundancy built into arrays performs repairs by replacing failed addresses (in this example, wordlines) with spare wordlines.

Referring now to FIG. 3, this particular FIGURE illustrates an embodiment of the invention which includes failed address function logic 56 and data output register 58 which are used to identify a specific address at which an error occurred and which is used in the invention described with respect to FIG. 4. In the event data comparator 14 detects a data error the failed data pattern or a portion of the failed data pattern is coupled to the data output register 58. Bus 48 couples the address of the failed data output to the failed address function logic 56, which identifies the address of the failed data output.

In accordance with our preferred embodiment, which is further illustrated by FIG. 4, we begin to discuss the repairing method. For purpose of illustration, we assume that the array has eight normal wordlines (10a to 10h) with the understanding that actual array products usually have thousands of wordlines. For the simplicity of explanation, it is also assumed that there are only two spare wordlines (20a and 20b) which can take the place of any two normal wordlines (any two of WL0 to WL7). It is understood that there is no restriction on the number of spare wordlines although we assume two in this embodiment. Each wordline is driven by a decoder. Each normal decoder (30a to 30h) receives an unique combination of true (40a to 40c) and/or complement (50a to 50c) address signals at its input terminals X, Y, and Z. It is understood that larger array requires more than 3 address inputs to drive a normal decoder. The address bits which define the selection of a wordline are feeding a set of true-and-complement buffers (220). True and complement address lines (40, 50) are outputs of these buffers.

Each decoder (30a to 30j) has a terminal T which is connected to array's internal timing generator (240). The outputs of the non-inverted address buffers (40a to 40c) and the outputs of the inverted address buffers (50a to 50c) are connected to the (XYZ) terminals of the normal decoders (30a to 30h) in unique combinations to determine which decoder is to be selected. The on-chip array timing generator (240) will generate a wordline activation signal TW (60) to determine when the selected wordline (any one of 10a to 10h or 20a or 20b) should go high. The terminal I of each normal decoder receives a decoder inhibit signal (70) which will inhibit all normal decoders (30a to 30h) when any one of the spare decoder (20a or 20b) is selected. If the normal decoder is inhibited, its wordline (WL0 to WL7) will not go high. Terminal W is the normal decoder output which drives the wordline (10a to 10h) directly. The logical behavior of the normal decoder (30a to 30h) is represented by a 3-way-NOR (80), 3-Way-AND (90), and an Inverter (100). Actual decoder implementation can take on numerous forms of static or dynamic circuitry.

Each spare decoder (30i, 30j) has two input terminals. Terminal S (110a or 110b) receives a logic ONE when the spare decoder is selected for replacing a particular normal decoder (30a to 30h). Terminal T receives the timing signal (60) in the same way as do the normal decoders to determine when the spare decoder(s) is(are) activated. Output terminal DW drives the spare wordline (20a or 20b) directly. The logical behavior of the spare decoder (30i, 30j) is represented by an AND gate (120) whose actual implemention can take on numerous forms of static or dynamic circuitry.

Spare decoder (30j) for making use of the redundancy in the array is possibly selected during manufacturing test. The MRFL, Manufacture Replacement Fuse Logic (130) determines whether spare decoder (30j) is needed or not by a replace_needed signal (140) within the MRFL (130). The wordline address needed to be replaced is defined by a 3-bit bus (150). The value of the replace_needed signal (140) and the value of the faulty address (150) are correctively called "fuse vector". Having gone through manufacturing test, the fuse box (230) within MRFL (130) is burned once and permanantly determines the fuse vector. When spare decoder (30j) is selected, the select line (110b) is on when incoming address (190) matches the manufacturing determined faulty address (150). Also at the same time, all normal decoders are inhibited through the OR-gate (140) which causes the decoder inhibit signal (70) to be ON. The spare decoder (30j), whose usefulness is determined by the manufacturing test, will drive the spare wordline RWL_MFG (20b) for the manufacturing determined faulty address (150) generated from the fuse box (230).

Spare decoder (30i) can be selected dynamically during system environment. Upon detection of an array error when array is running in system mode, the recovery logic will order the sytem to stop temporarily and the on-chip ABIST (Array Built-In Self Test) engine (250) to run array test programs. The result of these test program execution will determine the faulty address which is latched in a register within the ABIST engine. This ABIST detected faulty address is then scanned into a hold-type register (160) via a one-bit interface line (170) within the DRL, Dynamic Replacement Logic (180). Multi-bit register (160) consists of the 3-bit faulty word address (160a) and a one bit replace_needed signal (160b) which is set to ONE when spare decoder (30i) is intended to be used. The activated spare decoder (30i) will drive the spare wordline RWL_SYS (20a) for on-line sparing in system environment.

Address bus (190) consists of all address bits (A0 A1 A2) for defining which wordline is selected is compared with both the fused address (150) and the ABIST generated address (160a) via comparators (200 or 210). If match is detected in one or both comparators, the respective replace_needed bit (140 and/or 160b) will be ON, one or both spare decoders are switched for use by virtue of AND gates (260, 270).

Also, the normal decoders are inhibited because either signal 110a or 110b will cause the decoder inhibit signal (70) to be ON. The faulty address from the fuse box (230) is fixed after fuses are burned during manufacturing test. But the faulty address (160a), which is determined from ABIST test, can be activated during system operation.

Figure 5:
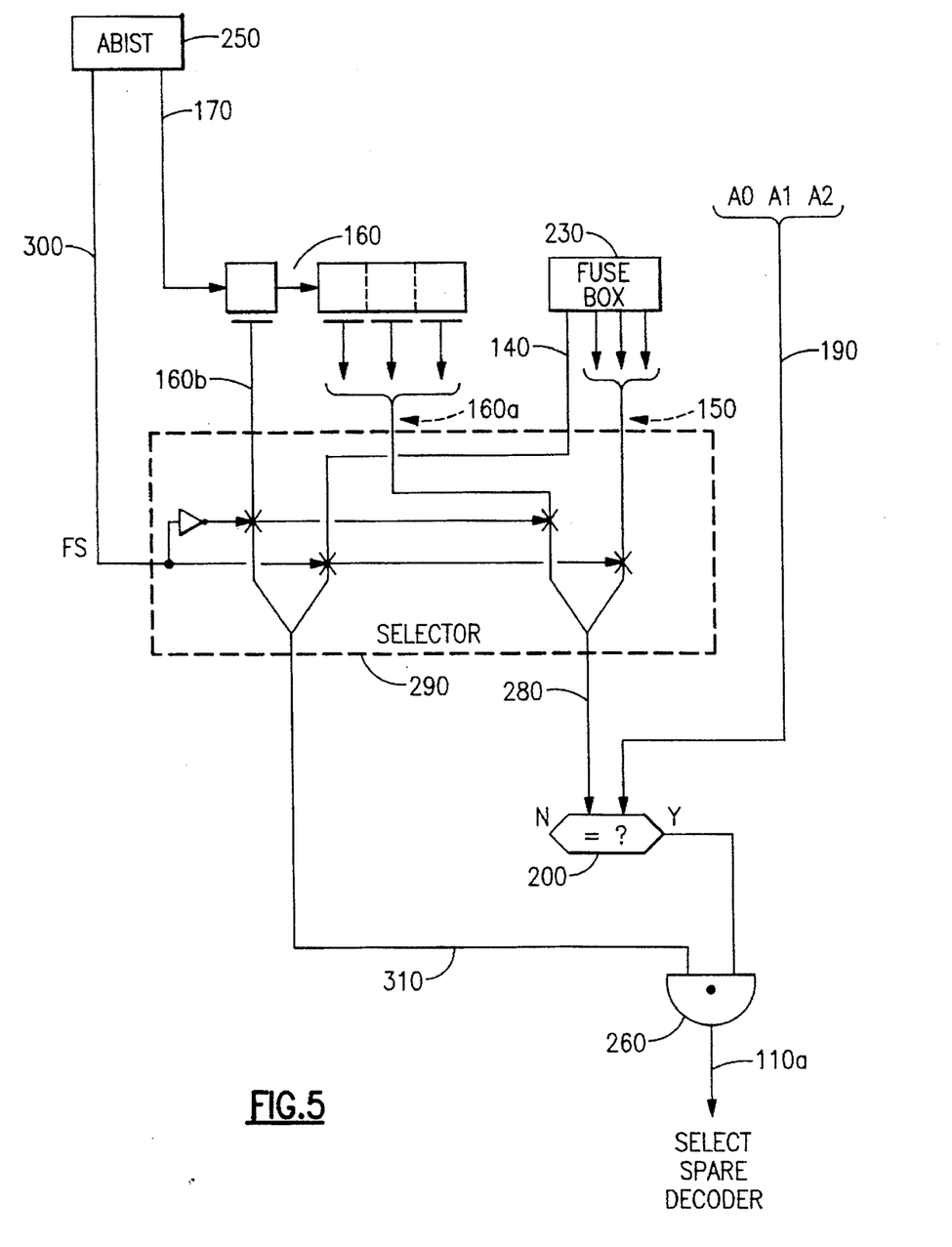
FIG. 5 is schematic illustration of an alternative for the preferred embodiment which illustrates an alternative arrangement which may be used for performing repairs in the field when used with the structure of our preferred embodiment of a computer system array element.

The MRFL (130) and DRL (180) of FIG. 4 can be combined into an alternate arrangement as shown in FIG. 5. The faulty word address (280) can be taken from the ABIST loaded register (160) or from the fuse box (230) by means of a selector (290) which is controlled by a fuse select signal, FS (300) generated by the ABIST engine (250). When FS (300) is high, the faulty address (150) defined by the fuses is selected. When FS is low, the faulty address defined by the register (160a) is selected. The spare_needed signal (310) is selected in the like manner. It either comes from the fuse box line (140) or from the ABIST loaded register (160b). The incoming address (190) is compared with the selected faulty address (280) via comparator (200). If match is detected and the selected replace_needed signal (310) is high, spare decoder select signal (110a) will be ON due to the AND gate (260). In this case, the spare decoder (30i) is selected to take the place of a normal decoder (one of 30a to 30h).

Wordline Repairing Algorithm

Having described the hardware needed for sparing, we now describe an example of wordline repairing methodology:

Step 1 System is reset ready for running ABIST. Register bit (160b) is reset to ZERO.

Step 2 ABIST (250) executes test programs with fuse select signal FS (300) set at ZERO. This will ensure spare decoder will not be selected by signal (110a) and hence normal decoders (30a to 30h) are used.

Step 3 At the end of test programs execution, if ABIST finds no array error, one of the two actions will be taken:

ABIST sets signal FS (300) to ONE, and fuse vector is blown in such a way that signal (140) is ZERO. Or ABIST sets signal FS (300) to ZERO, and register bit (160b) is set and held at ZERO.

Test is done and no repair action is needed. If, however, ABIST (250) tests finds an error, the next step should be taken.

Step 4 The faulty word address found by ABIST (250) is loaded into the register (160) via the one bit interface line (170). Note that register bit (160b) must be at ONE.

Step 5 Re-run ABIST test programs with FS (300) at ZERO. If ABIST finds no error, it means faulty address has been confirmed. If not, repeat the above procedure with other available sparing logic of FIG. 2.

Step 6 Have the fuse box vector blown to the configuration identical to the content of the register (160).

Step 7 Re-run ABIST programs with FS signal (300) is ONE. If no error is is found, it means repairing is successful.

Step 8 ABIST (250) sets FS signal (300) is ONE permanently. The repaired array is all good in the sight of the users.

The above mentioned procedure of the concept will allow engineers to come up with many other procedures or algorithms to exploit the available redundancy of the array/or repairing hardware of FIG. 5.

Figure 6:
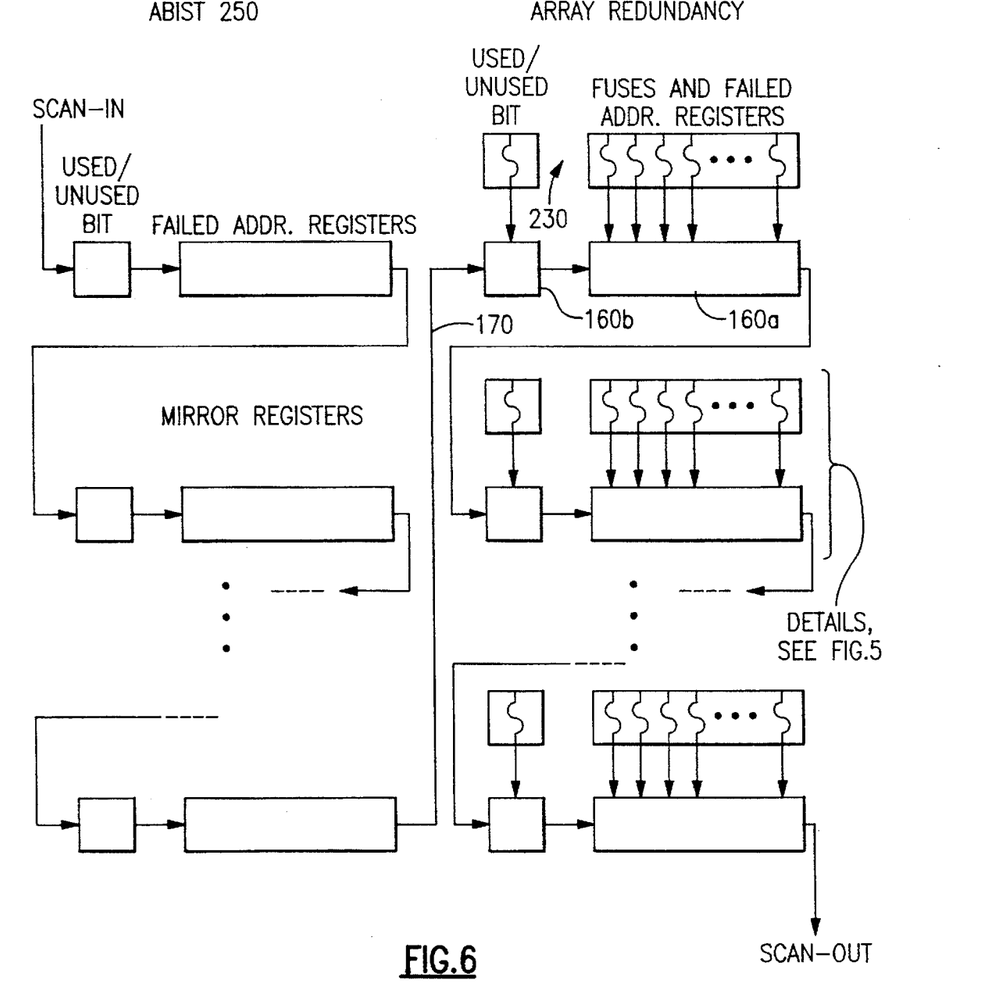
FIG. 6 is schematic illustration of our preferred and alternative preferred embodiments which illustrates how the ABIST makes use of mirror registers and faulty address registers.

While FIG. 5 shows only one set of repairing hardware, it is possible that an array macro has several sets of spare wordlines. FIG. 6 shows for each set of faulty word address register (160), ABIST (250) has a set of mirror registers. ABIST first loads these mirror registers with proper configuration and then has it copied into the faulty address registers (160) through scanning. These mirror registers and the faulty address registers (160) are chained together through the one bit interface line (170) as shown in FIG. 6.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A computer system element comprising:

a VLSI array for storing information having redundant areas, and an array built-in, on-chip test system (ABIST) for testing said VLSI array, said ABIST having data input ports, data output ports, and address ports, and including:

a data control register for generating and applying deterministic data patterns to the data input ports of said VLSI array;

an address control register for generating addresses for application to said array chip in coordination with said data control register;

a comparator for comparison of data inputted to said data input ports of said VLSI array from said data control register with data outputted from said data output ports of said VLSI array, said comparator including a failing address function store for retaining failing addresses;

a memory array for storing a plurality of microcode control vectors for test sequence control by logical test vectors which can be changed for use in self-test of said VLSI array in a system containing said VLSI array after manufacture of the system containing said VLSI array when said self-test is performed on site at power-on reset of the system containing said VLSI array, each vector including a data control register field, an address control register field, the microcode pointer control register field and a read/write enable control field;

a microcode pointer control register and finite state machine for means controlling said address control register, said data control register and said microcode pointer control register in response to said plurality of microcode control vectors and to an overflow feedback state of said data control register and said address control register, and wherein said VLSI array includes redundant areas for replacing normal functional areas of the VLSI array with ABIST comparator retained failing addresses indicating a hardware error has been detected on said power-on of said computer system element.

2. A computer system element according to claim 1, wherein said hardware error is found in them after a computer system having the computer element is shipped to a customer location, and said hardware error is repaired by replacing failing addresses with spare wordlines, during power-on reset.

3. A computer system element according to claim 1 wherein said VLSI array provides spare wordines, each spare wordline being provided with its own bank of fuses enabling the storing of the address of the failing wordline it will replace by blowing the enabling fuses.

4. A computer system element according to claim 3 wherein said VLSI array has for each bank fuses has a shadow scanable register which during repair can either be loaded with the fuse values, or used to override the fuse values of the wordline by a burn-in of fuse with its own values.

5. A computer system element comprising, a VLSI array of cells for storing information in the form of bits, bitlines and wordlines, including a redundant array store area which includes a set of fuse registers for said VLSI array bits, bitlines and wordlines, an array built-in, on-chip test system (ABIST) for testing said VLSI array, said ABIST having data input ports, data output ports, and address ports, and including:

a data control register for generating and applying deterministic data patterns to the data input ports of said VLSI array;

an address control register for generating addresses for application to said array chip in coordination with said data control register;

a comparator for comparison of data inputted to said data input ports of said VLSI array from said data control register with data outputted from said data output ports of said VLSI array, said comparator including a failing address function store for retaining failing addresses; and said ABIST further including a a set of registers which mirrors the redundancy fuse registers of said VLSI array.

6. A computer system element comprising:

a VLSI array for storing information having redundant areas, and an array built-in, on-chip test system (ABIST) for testing said VLSI array, said ABIST having data input ports, data output ports, and address ports, and including:

a data control register for generating and applying deterministic data patterns to the data input ports of said VLSI array;

an address control register for generating addresses for application to said array chip in coordination with said data control register;

a comparator for comparison of data inputted to said data input ports of said VLSI array from said data control register with data outputted from said data output ports of said VLSI array, said comparator including a failing address function store for retaining failing addresses;

a memory array for storing a plurality of microcode control vectors, each vector including a data control register field, an address control register field, the microcode pointer control register field and a read/write enable control field;

a microcode pointer control register and finite state machine for means controlling said address control register, said data control register and said microcode pointer control register in response to said plurality of microcode control vectors and to an overflow feedback state of said data control register and said address control register, and wherein said VLSI array includes redundant areas for replacing normal functional areas of the VLSI array with ABIST comparator retained failing addresses indicating a hardware error has been detected on power-on of said computer system element, said redundant areas including a plurality of wordlines and a plurality of spare wordlines that can be used to replace other wordlines of the array, each wordline being driven by a wordline decoder having a plurality of input terminals for receiving signals responsive to an address for determining when a selected wordline is to be selected, can be used to replace other wordlines of the array, each spare wordline being driven by a spare wordline decoder having a plurality of input terminals for receiving signals responsive to an address for determining when a selected spare wordline is to be selected, fuse logic for determining whether or not a spare decoder is needed, and if needed for providing a replace_needed signal and the value of a faulty address as a fuse vector, said fuse vector determing which spare wordline is to be selected, said fuse logic being activated upon detection of a faulty address during manufacturing test or during detection of an array error when said array is running in system mode.

7. A computer system element according to claim 6, wherein when an array error is found after a computer system having the computer element is shipped to a customer location, and said hardware error is repaired by replacing failing addresses with spare wordlines, during power-on reset.

8. A computer system element according to claim 6 wherein there is provided an ABIST loaded register for said VLSI array, and a fuse or ABIST loaded register selection logic is provided, said fuse or ABIST selection logic being controlled by an ABIST provided fuse select signal for causing said fuse vector to utilize a faulty address defined by said fuse logic or to utilize a faulty address defined by said ABSIT loaded register, said fuse vector determining which spare decoder is to replace a normal decoder.

9. A computer system element according to claim 6 wherein each set of faulty address registers is mirrored with a set of mirror registers, and said repair process includes loading said mirror registers with a proper configuration and then causes said proper configuration to be copied into said faulty address registers.

* * * * *